United States Patent [19]
Ranson

[11] Patent Number: 5,689,202
[45] Date of Patent: Nov. 18, 1997

[54] INTEGRATED CIRCUIT FOR AUTOMATIC DETERMINATION OF PCI SIGNALING ENVIRONMENT—EITHER 3.3V OR 5V

[75] Inventor: Cheryl A. Ranson, Ft. Collins, Colo.

[73] Assignee: Hewlett-Packard Co., Palo Alto, Calif.

[21] Appl. No.: 580,402

[22] Filed: Dec. 28, 1995

[51] Int. Cl.$^6$ ........................................ H03L 7/00
[52] U.S. Cl. ............................... 327/142; 327/77
[58] Field of Search ........................... 326/16, 80, 81; 327/51, 57, 77, 78, 80, 81, 87, 90, 142, 143, 205, 215, 319, 333

[56] References Cited

U.S. PATENT DOCUMENTS

| | | | |
|---|---|---|---|
| 4,473,759 | 9/1984 | Mahabadi | 327/530 |
| 5,097,157 | 3/1992 | Jaffe et al. | 307/530 |
| 5,192,878 | 3/1993 | Miyamoto et al. | 327/77 |
| 5,245,223 | 9/1993 | Lim et al. | 327/80 |
| 5,274,275 | 12/1993 | Colles | 327/78 |
| 5,343,086 | 8/1994 | Fung et al. | 327/77 |
| 5,378,936 | 1/1995 | Kokubo et al. | 327/77 |
| 5,534,801 | 7/1996 | Wu et al. | 326/81 |
| 5,541,538 | 7/1996 | Bacrania et al. | 327/77 |

Primary Examiner—Timothy P. Callahan
Assistant Examiner—Jeffrey Zweizig

[57] ABSTRACT

An integrated circuit automatically detects a Peripheral Component Interconnect signaling environment, which may be based on either a first voltage or a second voltage, and matches output voltage and output current characteristics of an output signal with Peripheral Component Interconnect signal specifications. The integrated circuit includes a signaling environment detection circuit and an output driver circuit. The signaling environment detection circuit compares an integrated circuit supply voltage with a reference voltage, whose value is between the first voltage and the second voltage, and generates a detected environment signal representative of the signaling environment. The output driver circuit adjusts the output voltage and output current of the output signal to match the Peripheral Component Interconnect signal specifications based on the detected environment signal by sourcing additional current to the output pad to match the Peripheral Component Interconnect signal specifications when the detected environment signal indicates a signaling environment based on the first voltage, and sinking additional current from the output pad to match the Peripheral Component Interconnect signal specifications when the detected environment signal indicates a signaling environment based on the second voltage.

11 Claims, 6 Drawing Sheets

INTEGRATED CIRCUIT FOR AUTOMATIC DETERMINATION OF PCI SIGNALING ENVIRONMENT— EITHER 3.3V OR 5V

FIELD OF THE INVENTION

The present invention relates generally to integrated circuit environment compatibility, and more particularly to a method and apparatus for automatically detecting the PCI signaling environment based on the supply voltage of an integrated circuit.

BACKGROUND OF THE INVENTION

A recent advancement in integrated circuit fabrication technology has been the introduction of integrated circuits requiring only a 3.3 volt power supply. The lower 3.3 volt supply voltage (as opposed to the conventional 5 volt supply voltage) allows integrated circuits to have smaller geometries and better performance without compromising reliability or quality.

The introduction of the 3.3 V integrated circuits has had an impact on the design of integrated circuit (IC) systems, particularly with respect to compatibility with other components incorporated into the IC system. For example, standard commercially available components conventionally used in an IC system environment may be compatible with only one but not both of the 3.3 V or the 5 V signaling environments. However, even those components which are compatible with either the 3.3 V or the 5 V signalling environment may require the environment to be determined by the user and communicated to the device, as for example, through setting a jumper or switch, or through a program command.

One commercially available interface which is often used in integrated circuit system designs is the Peripheral Component Interconnect (PCI). The PCI electrical definition provides for both 5 V and 3.3 V signaling environments. These should not be confused with 5 V and 3.3 V component technologies. A 5 V component can be designed to work in a 3.3 V signaling environment and vice versa; components technologies can be mixed in either signaling environment. The signaling environment cannot be mixed; all components on a given PCI bus must use the same signaling convention of 5 V or 3.3 V. The design of a single component which could operate in either environment would allow greater flexibility in IC systems because only a single component rather than two separate components would be required. Thus, it would be desirable to provide a method and apparatus which automatically detects the system signaling environment and conforms to the appropriate PCI environment specification.

SUMMARY OF THE INVENTION

It is an object of the invention to provide a method and apparatus for automatically detecting a PCI signaling environment detection circuit.

It is also an object of the invention to provide an automatic PCI signaling environment detection circuit which does not require external pins or additional off-chip circuitry.

It is a further object of the invention to provide high frequency filtering in order to reduce noise on the voltage supply signal coupled to the bus.

It is yet another object of the invention to provide a circuit with low power consumption and which occupies a minimal amount of space.

In accordance with the above objectives, the present invention provides a method and apparatus for automatically determining the PCI signaling environment. This invention may be used in integrated circuits which receive a core $V_{DD}$ supply voltage (5 V) and a separate $V_{CC}/IO$ supply voltage (either 5 V or 3.3 V). It is assumed that the $V_{CC}/IO$ supply voltage is directly indicative of the PCI signaling environment on the IC system bus.

The present invention includes a method and circuit for automatically detecting a signaling environment of a PCI bus for matching output voltage and output current characteristics according to the PCI specifications. The signaling environment may be based on one of either a first voltage (3.3 V) or a second voltage (5 V), the second voltage representing the higher of the two.

In accordance with the present invention, the $V_{CC}$ supply voltage (as opposed to the core supply voltage $V_{DD}$) is compared to a reference voltage derived from the core supply voltage $V_{DD}$ to produce a detected environment signal representative of the PCI signaling environment. The reference voltage represents a nominal value between the first voltage and the second voltage. Based on the detected environment signal, the output voltage and output current of an output signal driven on the output pad is adjusted to match the PCI specifications. The output adjustment is accomplished by sourcing more current when the detected environment signal indicates a PCI signaling environment based on the first voltage, and sinking additional current when the detected environment signal indicates a PCI signaling environment based on the second voltage.

Also in accordance with the present invention, there is provided a circuit which includes an automatic PCI signaling environment detection circuit and an output driver having output characteristics adjustment circuitry. The automatic PCI signaling environment detection circuit is connected to receive both the $V_{CC}$ supply voltage and a reference voltage. The reference voltage is derived via a resistor divider network from a core supply voltage $V_{DD}$ which must be the higher (5 V) of the first and second voltage. The reference voltage represents a nominal value (4.175 V) between the first voltage and the second voltage. The automatic PCI signaling environment detection circuit compares the $V_{CC}$ supply voltage with the reference voltage to produce a detected environment signal representative of the PCI signaling environment. In a preferred embodiment, the signaling environment detection circuit is implemented with a differential input amplifier for providing a threshold comparison of the $V_{CC}$ supply voltage with the reference voltage and for providing a high common mode rejection ratio, followed by a pair of source followers and a RAM sense latch for isolating the detected environment signal from the output of the amplifier to provide high pass filtering of the voltage supply noise.

The present invention may also include an output driver circuit connected to receive the detected environment signal and to drive output signals on an integrated circuit output pad. The output driver circuit includes an output characteristics adjustment circuit for adjusting the output voltage and output current of an output signal to match the PCI specifications.

The design of the invention contains several advantages. First, no external pins or additional off-chip circuitry is required. The reference is generated on-chip via a resistor divider network powered from the core supply $V_{DD}$ (5 V). The $V_{CC}$ input signal to the invention is tapped off from the power ring routed internal to the chip. The clocking/latching mechanism is also provided on-chip. A second feature of the circuit is a built-in high-pass filter. Any high frequency noise on the $V_{CC}$ signal or the core $V_{DD}$ signal will be filtered before latching occurs and the output signal is driven to the I/O ring. Several other advantages/features include low power consumption (23.65 mW in the preferred embodiment), small area (153 um×352 um in the preferred embodiment), and built-in static current testability.

BRIEF DESCRIPTION OF THE DRAWING

An illustrative and presently preferred embodiment of the invention is shown in the accompanying drawings in which.

DETAILED DESCRIPTION OF THE INVENTION

Figure 1:
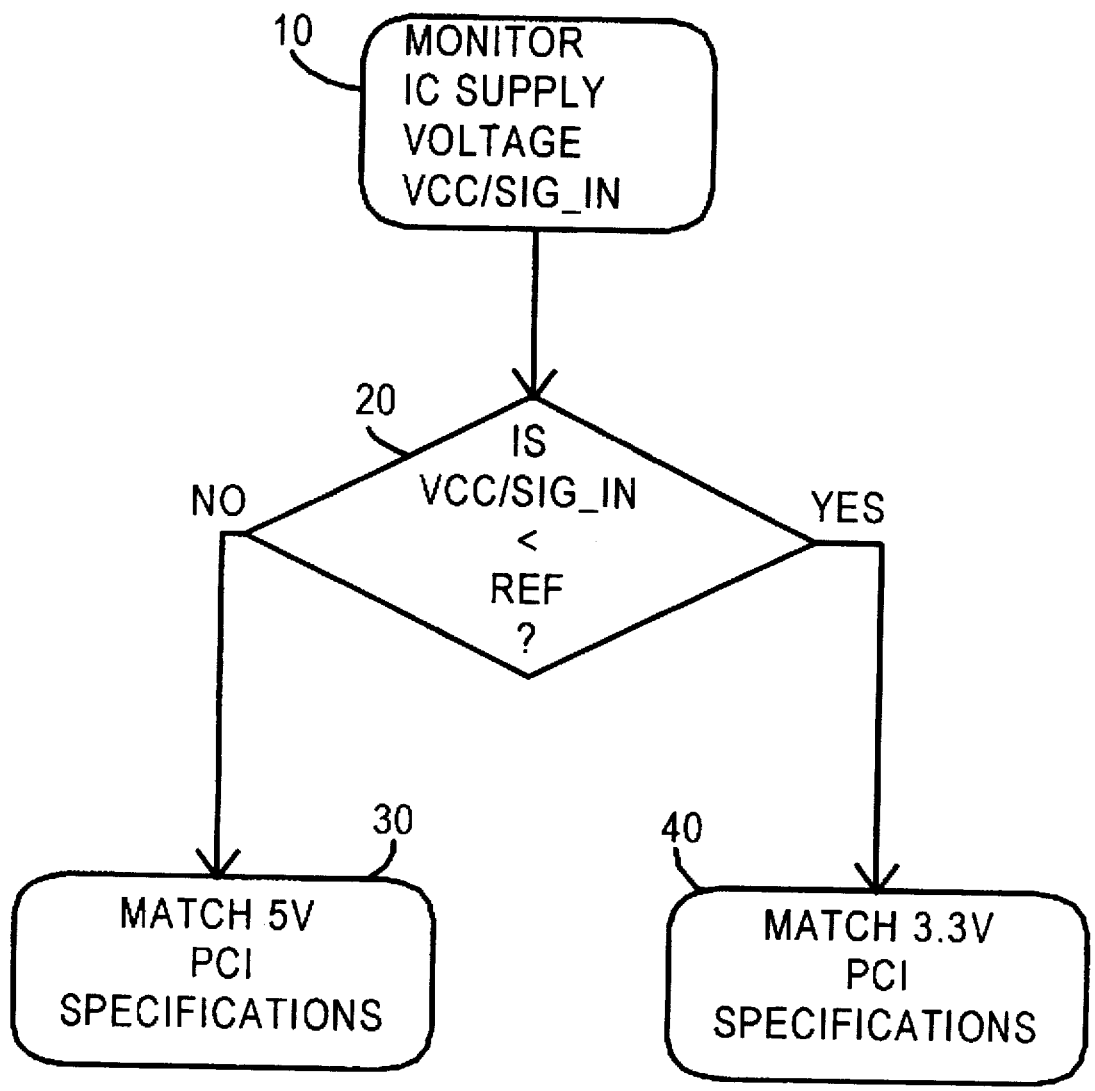
FIG. 1 is a flow diagram detailing a method for providing automatic PCI signaling environment detection.

The drawing, in general, depicts a method and apparatus for providing automatic determination of a PCI signaling environment in accordance with the present invention, and for use in non-mixed IC systems based on either a 3.3 V or 5 V supply voltage.

There is shown in FIG. 1 a flow diagram illustrating the methodology for automatically determining the PCI signaling environment. As shown in FIG. 1, the method in accordance with the present invention includes a first step 10 of monitoring the IC supply voltage $V_{CC}$. In the preferred embodiment, the IC supply voltage $V_{CC}$ is either 3.3 V or 5 V. The value of the $V_{CC}$ supply voltage is compared to a reference voltage in a second step 20. The nominal value of the reference voltage in the preferred embodiment is 4.175 V. If the $V_{CC}$ supply voltage is greater than the reference voltage, a 5 V PCI signaling environment exists, and in a third step 30 the output driver provides the appropriate drive capability as defined by the PCI specifications for a 5 V PCI signaling environment. If the supply voltage is less than the reference voltage, a 3.3 V PCI signaling environment exists, and in a fourth step 40 the output driver provides the appropriate drive capability as defined by the PCI specifications for a 3.3 V PCI signaling environment.

Figure 2:
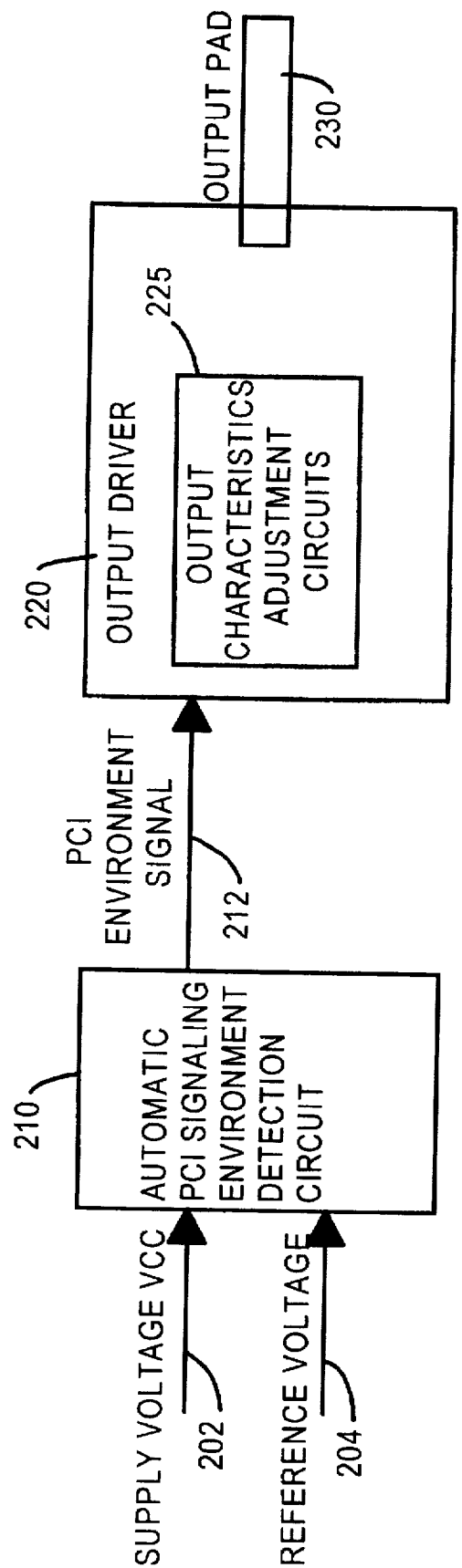
FIG. 2 is a schematic block diagram of an apparatus for providing automatic PCI signaling environment detection.

FIG. 2 shows a block diagram of an apparatus in accordance with the methodology of the present invention shown in FIG. 1. As shown in FIG. 2, the apparatus in accordance with the present invention includes an automatic PCI signaling environment detection circuit 210 which is connected to receive the IC supply voltage $V_{CC}$ 202, which in the preferred embodiment will be either 3.3 V or 5 V. The automatic PCI signaling environment detection circuit 210 is also connected to receive a reference voltage 204, which in the preferred embodiment has a nominal value of 4.175 V. The automatic PCI signaling environment detection circuit 210 compares the value of the supply voltage $V_{CC}$ 202 to the reference voltage 204. If the supply voltage $V_{CC}$ 202 is greater than the reference voltage 204, a high voltage (5 V) environment exists, and the automatic PCI signaling environment detection circuit 210 produces a PCI environment signal 212 indicating a high voltage PCI signaling environment exists. If the supply voltage $V_{CC}$ 202 is less than the reference voltage, a low voltage (3.3 V) environment exists and the circuit accordingly produces a PCI environment signal 212 indicating a low voltage PCI signaling environment exists. The PCI environment signal 212 is routed to an output driver circuit 220, which drives an output pad 230. Contained within the output driver circuit 220 are output characteristics adjustment circuits 225 which receive the PCI environment signal 212, and which adjust the drive capability on the output pad 230 to match the PCI specifications according to the signaling environment indicated by the PCI environment signal 212.

Figure 3:
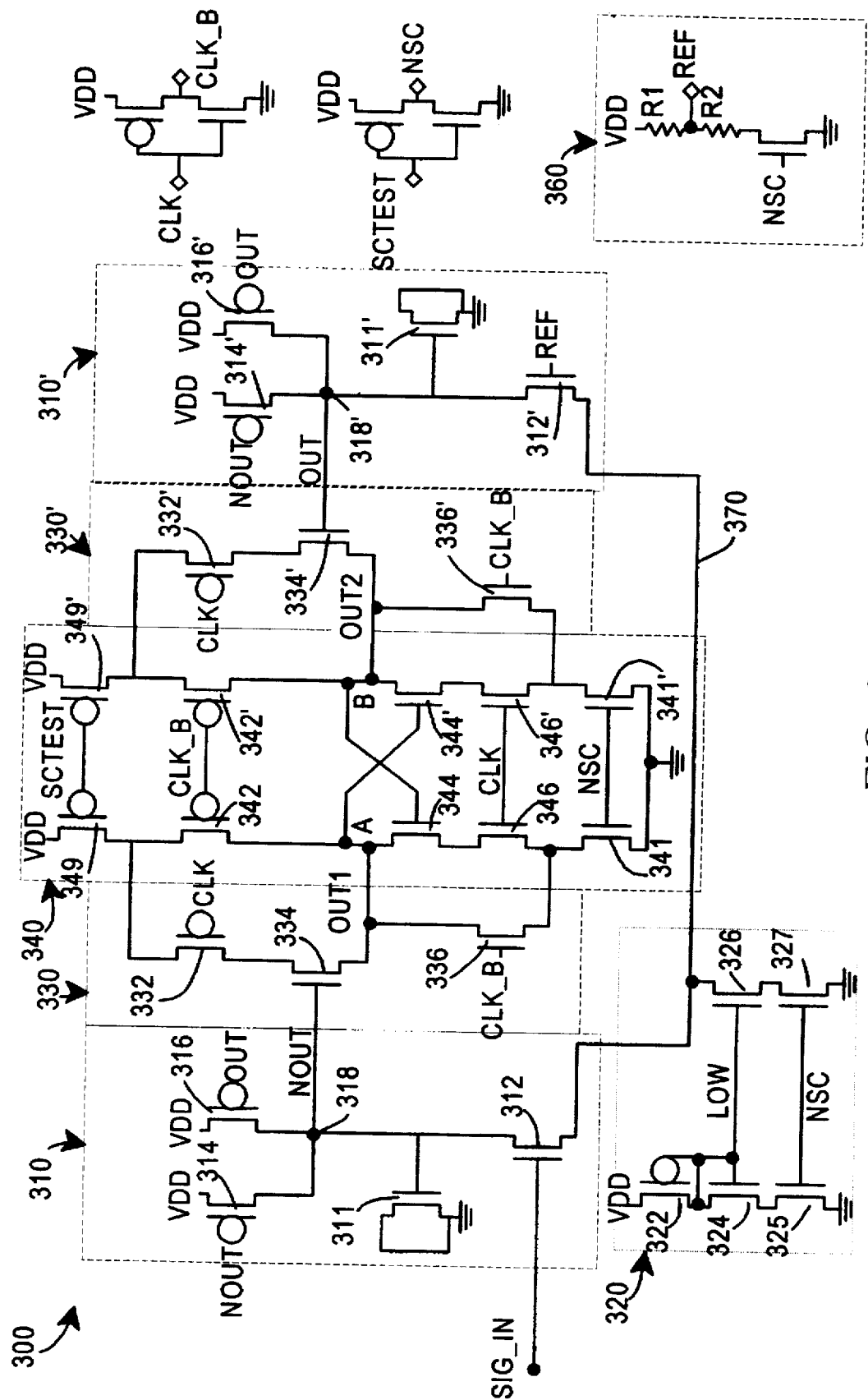
FIG. 3 is a schematic diagram of a preferred embodiment of a circuit which provides automatic determination of the PCI signaling environment in accordance with the present invention.

Referring to FIG. 3, wherein like numerals represent like elements, a schematic diagram depicts a preferred embodiment of the automatic PCI signaling environment detection circuit 210 shown in FIG. 2. The automatic PCI signaling environment detection circuit in FIG. 3, shown generally at 300, includes a differential input amplifier 310, 310', 320, a pair of source followers 330, 330', and a latch circuit 340 (embodied as a conventional RAM sense amp). As shown, the automatic PCI signaling environment detection circuit 300 is implemented using a plurality of NFETs (n-channel field effect transistors) and PFETs (p-channel field effect transistors).

The differential input amplifier 310, 310', 320 includes a pair of arm circuits 310, 310' and a tail current source 320. The differential input amplifier 310, 310', 320 receives the integrated circuit supply voltage $V_{CC}$ at an input labeled SIG_IN, and a reference voltage set to a nominal value (4.175 V in the preferred embodiment) at an input labeled REF. As shown in FIG. 3, the reference signal is derived from a core voltage $V_{DD}$, set to the high voltage (5 V), using a resistor divider network 360. In the preferred embodiment, the core supply $V_{DD}$ is 5 V and the resistors R1 and R2 have values of 1K and 5.061K respectively in order to obtain a reference voltage of 4.175 V.

Each arm circuit 310, 310' comprises a first PFET 314, 314' coupled to an NFET 312, 312' in drain-source series relationship with the tail current source 320 via line 370, as shown. Each arm circuit 310, 310' also comprises a second PFET 316, 316' coupled to the NFET 312, 312' in drain-source series relationship with the tail current source 320 via line 370, as shown. An output signal labeled NOUT is produced on a complemented output line 318 of the first arm amplifier circuit 310. The output line 318 is connected between the drain of first PFET 314, the drain of the second PFET 316, and the source of NFET 312. An output signal labeled OUT is produced on output line 318' of the second arm amplifier circuit 310'. The output line 318' is coupled between the drain of first PFET 314', second PFET 316', and the source of NFET 312'. The gate of each of the first PFETs 314, 314' is coupled to receive the complemented output signal NOUT, and the gate of each of the second PFETs 316, 316' is coupled to receive the output signal OUT.

The tail current source 320 comprises a PFET 322 coupled to NFETs 324, 326 so as to allow only a fixed amount of current to flow therethrough to ground, as shown. The arm circuit PFETs 314, 314', 316, 316' should be electrically matched to each other, as should the arm circuit NFETs 312, 312' to each other. The details of the electrical matching will be provided hereinafter. It will be appreciated from FIG. 3 that the arrangement of the FETs 312, 314, and 316 of the first arm amplifier circuit 310 is both physically and electrically symmetrical (about a centerline of the circuit layout of automatic PCI signaling environment detection circuit 300) with the FETs 312', 314', and 316' of the second arm amplifier circuit 310'. Importantly, the threshold voltage of the NFETs 312, 312' should be nearly identical.

Figure 4:
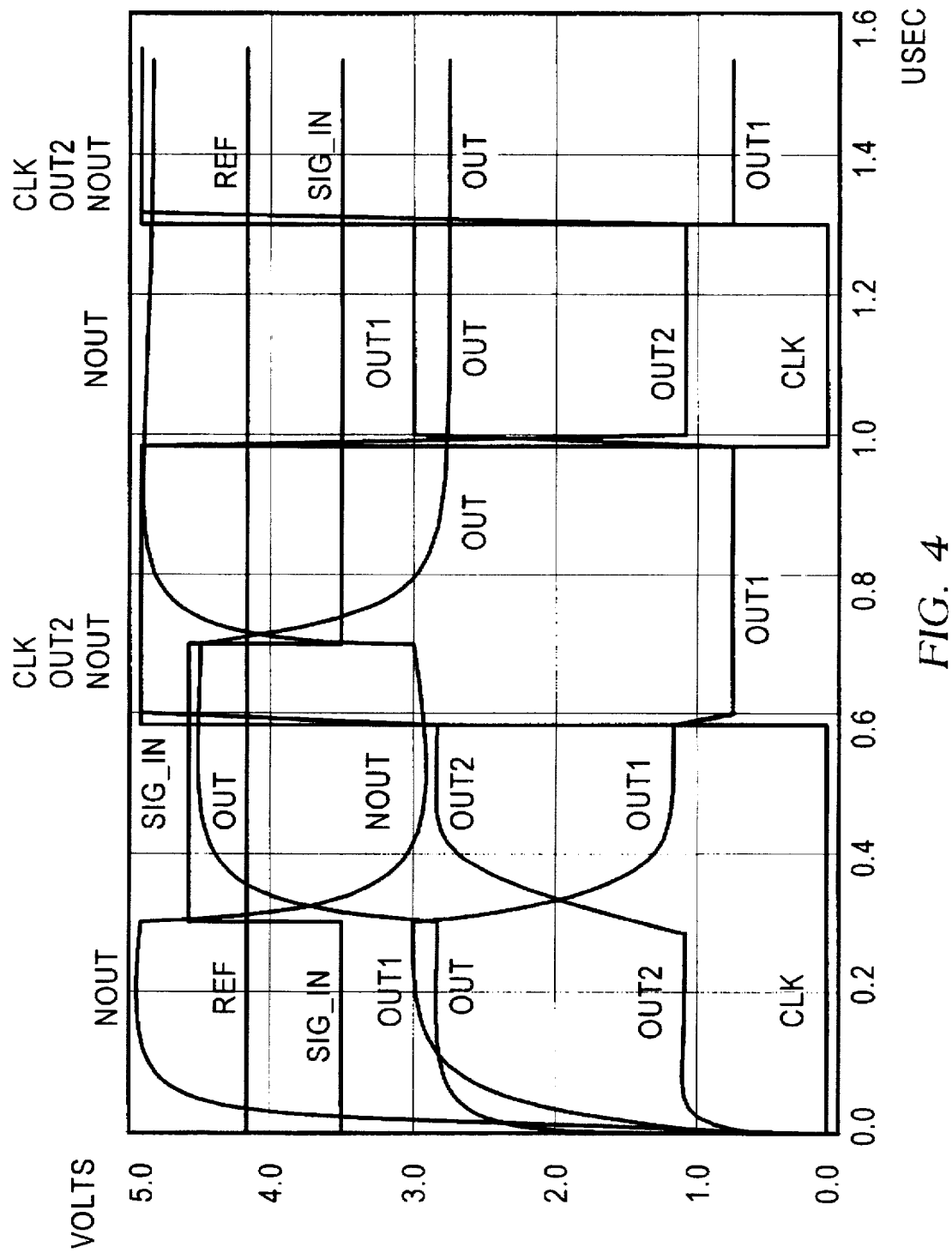
FIG. 4 is an exemplary timing diagram illustrating the operation of the circuit of FIG. 3.

Assuming initially that the sizing of the PFETs 314, 314', 316, 316' relative to the NFETs 312, 312' are as described hereinafter, the operation of the differential input amplifier 310, 310', 320 is as follows. FIG. 4 illustrates the operation of the differential input amplifier 310, 310', 320 (as well as the rest of the circuitry) for a reference signal REF having a nominal value of 4.175 volts in the preferred embodiment.

Upon a transition of the $V_{CC}$ supply voltage SIG_IN below the magnitude of the reference voltage REF (as seen in FIG. 4 between 0.0 and 0.3 usec), the gate-to-source voltage $V_{GS}$ of the NFET 312' will exceed the gate-to-source voltage $V_{GS}$ of NFET 312, causing more current to flow through the second arm amplifier circuit 310' than through the first arm amplifier circuit 310. This causes the magnitude of the output NOUT of first arm amplifier circuit 310 to exceed that of the output OUT of the second arm amplifier circuit 310', as shown in FIG. 4. Alternatively, upon a transition of the input signal $V_{CC}$ supply voltage at SIG_IN above the reference signal REF (as seen in FIG. 4 between 0.3 and 0.7 usec), the gate-to-source voltage $V_{GS}$ of NFET 312 will exceed the gate-to-source voltage $V_{GS}$ of NFET 312', causing more current to flow through the first arm amplifier circuit 310 than through the second arm amplifier circuit 310'. (The combined current flowing through both of the first and second arm amplifier circuits 310, 310' is limited by the tail current source 320; the voltage on line 370 will vary to keep the current on line 370 nearly constant). This causes the output NOUT of first arm amplifier circuit 310 to be of lower magnitude than the output OUT of second arm amplifier circuit 310', as also shown in FIG. 4.

It will therefore be appreciated that the differential input amplifier 310, 310', 320 provides first and second output signals (NOUT and OUT) having states indicative of the magnitude of the $V_{CC}$ supply voltage SIG_IN relative to the reference voltage REF, and that the first and second output signals OUT and NOUT are substantially complementary to each other. When the arm circuits 310, 310' are constructed as hereindescribed, it will detect the PCI signaling environment. That is, if the $V_{CC}$ supply voltage SIG_IN is 3.3 V, it will be less than the reference voltage REF, and will drive output NOUT high and output OUT low. On the other hand, if the $V_{CC}$ supply is 5 V, it will be greater than the reference voltage REF and will drive output OUT high and output NOUT low. Thus, the differential input amplifier 310, 310', 320 monitors the $V_{CC}$ supply voltage at SIG_IN, compares it to a nominal value reference voltage REF, and generates outputs OUT and NOUT. A low voltage on output signal OUT indicates that the PCI signaling environment is 3.3 V. Likewise, a low voltage on output signal NOUT indicates that the PCI signaling environment is 5 V.

The function of the source followers 330, 330' is to provide third and fourth output signals OUT1 and OUT2. When a clock signal CLK is in a first state, NOUT and OUT are isolated from the output, allowing latch 340 to provide OUT1 and OUT2. When the clock signal CLK is in a second state, source followers 330 and 330' sense the values on NOUT and OUT to provide signals OUT1 and OUT2 to the latch. In the exemplary timing diagram of FIG. 4, the first and second states of the clock signal CLK are high and low, respectively.

Each source follower 330, 330' is also defined by a plurality of FETs coupled in drain-source series relationship between the voltage source $V_{DD}$ and ground, as shown in FIG. 3. In particular, PFETs 332, 332' are coupled in drain-source series relationship with NFETs 334, 334', which in turn are coupled in drain-source series relationship with NFETs 336, 336'. The PFETs 332, 332' should be electrically matched to each other. Similarly, the NFETs 334, 334' should be electrically matched to each other, and the NFETs 336, 336' should also be electrically matched to each other. The details of the electrical matching will be provided hereinafter. As in the case of the differential input amplifier 310, 310', 320, the FETs comprising the pair of source followers 330, 330' are symmetrically arranged about the centerline of the circuit layout of the automatic PCI signaling environment detection circuit 300, as is evident from an inspection of FIG. 3.

The gate terminals of the PFETs 332, 332' each receive a clock signal CLK, while the gates of NFETs 336, 336' each receive the complement of the clock signal CLK_B. The gate terminal of the NFET 334 receives the output signal NOUT, while the gate of NFET 334' receives the output signal OUT.

The operation of each of the source followers 330, 330' is as follows, with reference to FIG. 4. When the clock signal CLK is in the second state (low), then PFETs 332, 332' and NFETs 336, 336' are biased to a generally highly conductive (i.e., generally low impedance) condition, thereby allowing NFETs 334, 334' to operate in accordance with the status of the output signals NOUT, OUT. Thus, the NFETs 334, 334' provide the third and fourth output signals OUT1, OUT2, to the latch 340 during this time. As will be appreciated hereinafter, the latch 340 is in a sense mode when the source followers 330, 330' are in this state. Alternatively, when the clock signal CLK is in a first opposite state (high), the PFETs 332, 332' and NFETs 336, 336' are biased to generally low conductivity (i.e., generally high impedance), whereby the NFETs 334, 334' are not significantly influenced by the states of these signals during this time, and the output signals OUT1 and OUT2 are not provided by the source followers 330, 330' during this time. The source followers 330, 330' therefore ensure that the output signals NOUT and OUT 318, 318' are isolated from the output of the automatic PCI signaling environment detection circuit 300.

The latch 340 may be a conventional, well-known RAM sense amp. As shown in FIG. 3, the latch 340 comprises a pair of cross coupled circuits, with each circuit comprising a plurality of FETs coupled in drain-source series relationship between the voltage source and ground. In particular, each circuit comprises a PFET 342, 342' coupled in drain-source series relationship with an NFET 344, 344', which in turn is coupled in drain-source series relationship with an NFET 346, 346'. The drain of the PFET 342 is cross coupled to the gate of the NFET 344', while the drain of the PFET 342' is cross coupled to the gate of the NFET 344 as shown.

The PFET 342 should be electrically matched to the PFET 342' while the NFET 344 should be electrically matched to the NFET 344', and the NFET 346 should be electrically matched to the NFET 346'. The details of the electrical matching are provided hereinafter. As will be apparent from FIG. 3, and as in the case of the arm circuits 310, 310' and source followers 330, 330', the FETs defining the latch circuit 340 should be symmetrically arranged about the centerline of the circuit layout of the automatic PCI signaling environment detection circuit 300.

The drain-source node A disposed between the PFET 342 and the NFET 344 receives the output signal OUT1. Similarly, the drain-source node B disposed between the PFET 342' and the NFET 344' receives the output signal OUT2. The gate terminals of the NFETs 346, 346' receive the clock signal CLK, while the gate terminals of the PFETs 342, 342' receives its complement CLK_B. It will be appreciated that when the clock signal CLK is in the second state (low), the PFETs 342, 342' and NFETs 346, 346' will be biased to a relatively low conductance (i.e., generally high impedance) condition. This defines the sense mode of the latch 340. During this time, the latch 340 simply receives and monitors the output signals OUT1, OUT2, provided by the source followers 330, 330'. However, upon a transition of the clock signal CLK from the second state to the first state (high), the PFETs 342, 342' and NFETs 346, 346' are biased to a generally high conductive (i.e., generally low impedance) condition, placing the latch 340 in a latch mode. The output signals OUT1, OUT2 will thereby be caused to assume a voltage level that tends toward either $V_{DD}$ or ground, depending upon the last sensed state of the signals OUT1, OUT2 at the time of the transition of the clock signal CLK from the second state (low) to the first state (high). During the time that the clock signal CLK is in the first state (high), the latch 340 will be unaffected by changes in the NOUT and OUT output signals. Thus, the function of the latch 340 is to sense the status of the third and fourth output signals OUT1, OUT2 when the clock signal is in the second state (low) and latch values indicative of the states of the third and fourth output signals OUT1, OUT2 last sensed upon a transition of the clock signal from the second state (low) to the first state (high). Therefore, the latched values are indicative of the status of the component $V_{CC}$ supply voltage SIG_IN relative to the reference voltage REF at the time of the transition of the clock signal from the second state to the first state.

The signals OUT1, OUT2 may be latched with an ordinary D-type latch although the electrical characteristics of the D-type latch should be such that it is compatible with the automatic PCI signaling environment detection circuit 300. In the preferred embodiment, the CLK signal is connected to the PCI reset signal.

The symmetry of the described automatic PCI signaling environment detection circuit 300 prevents any electrical biasing of the circuit in one direction or the other. This symmetry also ensures that no substantial differential noise will appear in symmetrically opposed portions of the circuit, due to its common mode rejection characteristic. The isolation of the differential input amplifier output signal by the source followers 330, 330' and the latch circuit 340 also operate as a high-pass filter to filter out supply voltage noise before it reaches the output pad.

The automatic PCI signaling environment detection circuit 300 will perform optimally when embodied in a CMOS large scale integrated circuit with the following sizings of the various FETs of the automatic PCI signaling environment detection circuit 300.

| FET | Size (width/length in microns) |
| --- | --- |
| 332, 332' | 30/1 |
| 314, 314' | 12/1 |
| 316, 316' | 12/1 |
| 334, 334' | 30/1 |
| 342, 342' | 10/1 |
| 344, 344' | 12/1 |
| 312, 312' | 30/1 |
| 336, 336' | 3/1 |
| 346, 346' | 60/1 |
| 322 | 3/1 |
| 324 | 10/1 |
| 326 | 20/1 |

Preferably the matched FETs 334, 334'; 344, 344'; 342, 342'; and 336, 336' each have a threshold voltage $V_T$ of within about ±20 millivolts. In one embodiment of the automatic PCI signaling environment detection circuit 300 using CMOS technology with the above FET sizings, an area of 153 um×352 um and a power consumption of 23.65 mW was achieved.

In addition, the automatic PCI signaling environment detection circuit 300 of FIG. 3 provides built-in high pass filters with capacitors 311, 311' in the first and second arm circuits 310, 310' of the differential input amplifier circuit 310, 310', 320. Thus, any high frequency noise on the $V_{CC}$ signal or the core $V_{DD}$ signal will be filtered before latching occurs and the output signal is driven to the IO ring.

FIG. 3 also illustrates a preferred embodiment of the invention which provides built-in static current testing capability. NFETs 325, 327, 341, 341', 349, and 349' are driven by a static current test signal SCTEST and its complement NSC to provide this capability.

Figure 5:
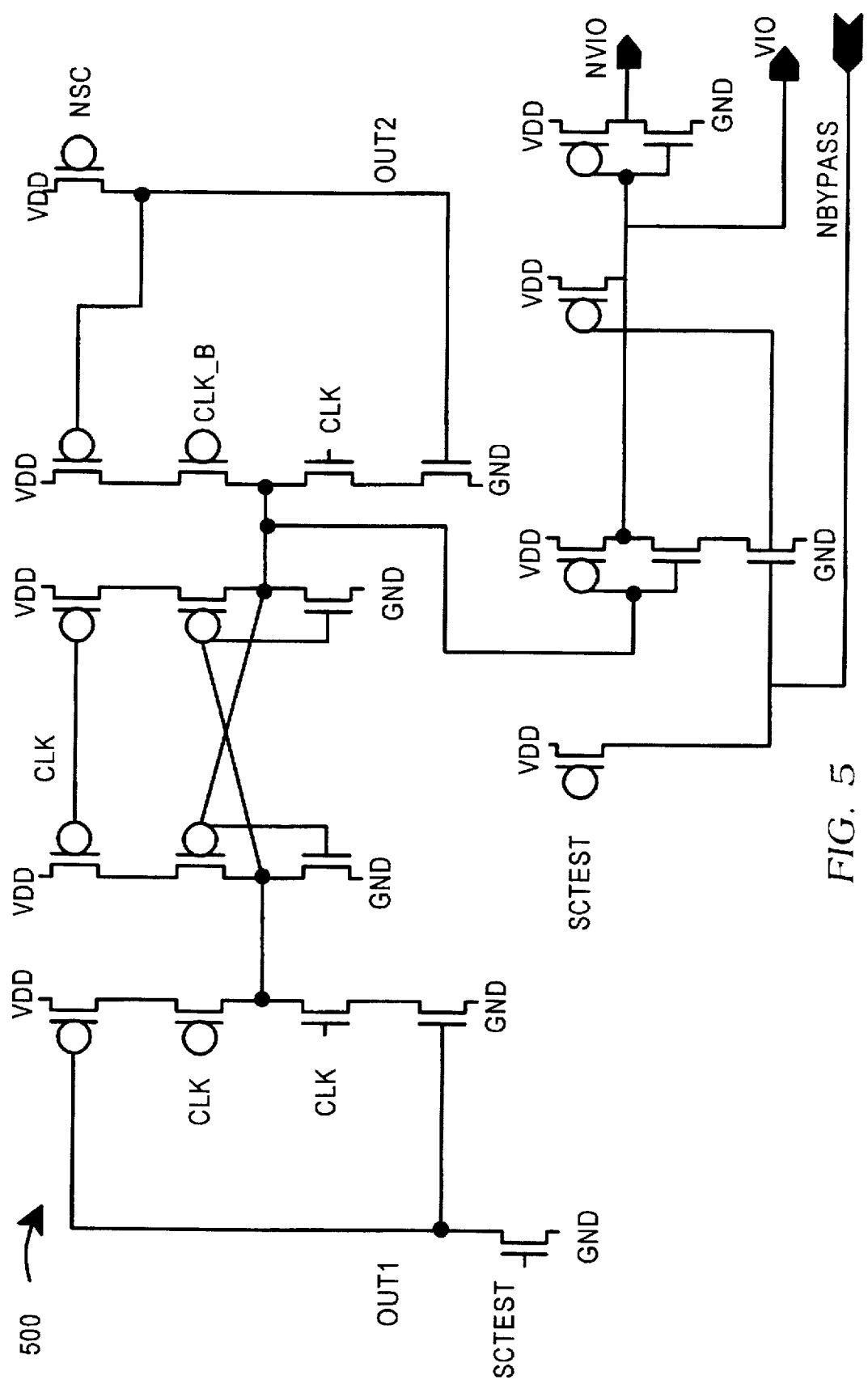
FIG. 5 is a schematic diagram of a circuit for providing level translation and buffering for input to an input/output driver.

FIG. 5 illustrates a preferred embodiment of a level translation and buffering circuit 500 for pulling the level of the signal OUT1 and OUT2 to their rails (0 V and $V_{DD}$ (5 V)) before being sent to the output driver. The preferred embodiment of the level translation and buffering circuit 500 shown in FIG. 5 is well known in the art. Thus, it will simply be noted that the signals OUT1 and OUT2 are monitored, pulled-down or pulled-up to the rails (0 V and $V_{DD}$ (5 V)) as appropriate, and converted to a detected PCI signal NVIO/VIO which has sufficient drive capability for input to subsequent circuitry (i.e., the output driver).

Figure 6:
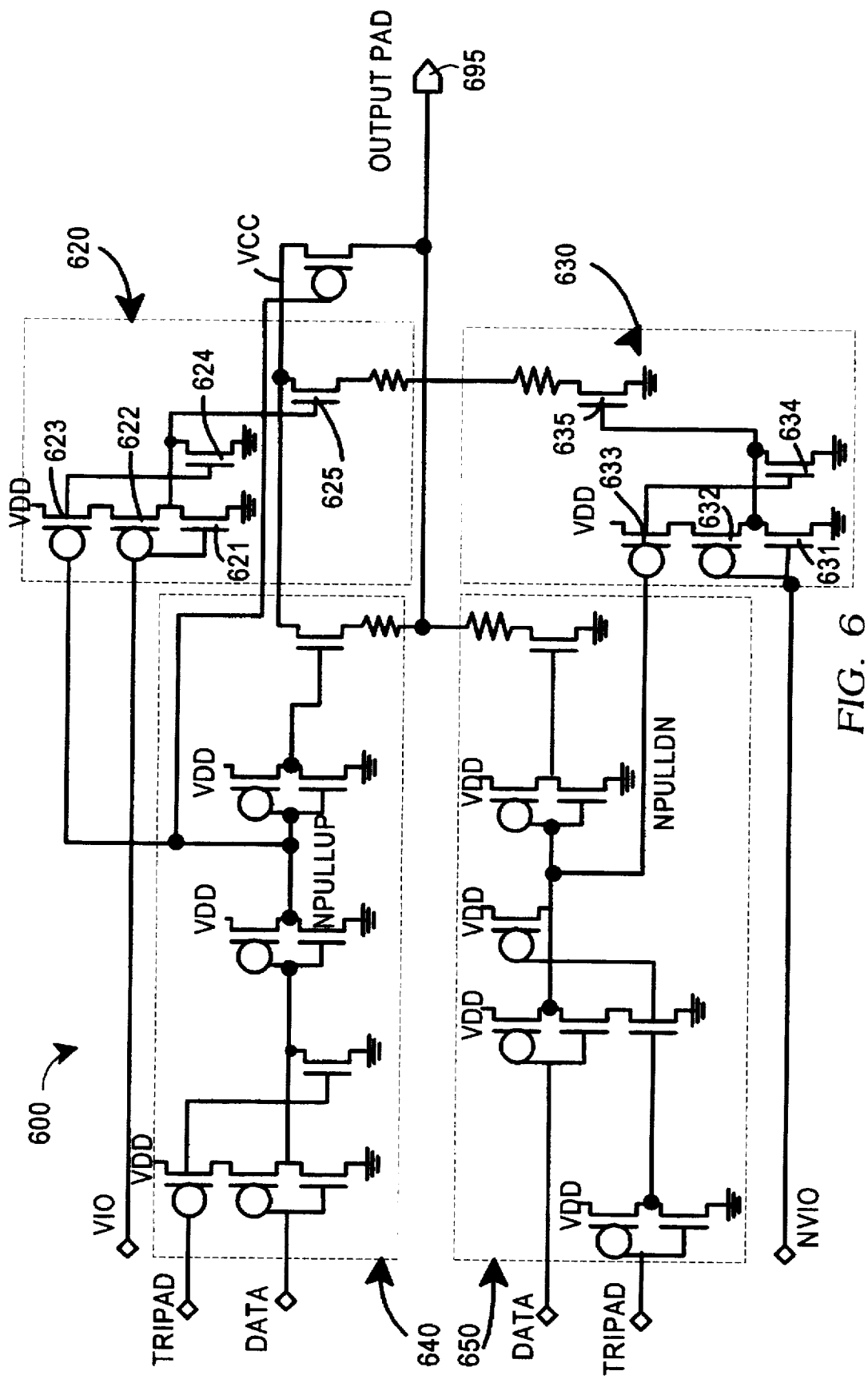
FIG. 6 is a schematic diagram of a PCI I/O driver circuit.

FIG. 6 illustrates a typical output driver 220 shown in FIG. 2. The output driver circuit in FIG. 6, shown generally at 600, receives the PCI detection signals VIO and NVIO (true and complement) from the automatic PCI signaling environment detection circuit 300 and automatically adjusts the output drive capability supplied to an output pad 695 to match the PCI specifications for the detected PCI signaling environment. As shown in FIG. 6, there is provided an output driver circuit 600 with an extra-pullup circuit 620 and an extra-pulldown circuit 630. As shown in FIG. 6, the output driver circuit 600 includes a pull-up/tristate stage 640 for driving an output signal high (3.3 V or 5 V) and a pull-down/tri-state stage 650 for driving an output signal low (0 V).

An important feature of FETs 625 and 635 in circuit 620 and 630 is that their sizing has been optimized such that the driver operates in the lowest portion of the PCI I-V curve allowable range. This provides less drive capability which has the advantage of allowing less noise or undue ringing in the system. In accordance with the present invention, extra drive capability on the pull-up side must be provided by the extra-pullup circuit 620 in a 3.3 V PCI signaling environment, whereas extra drive capability on the pull-down side must be provided by the extra-pulldown circuit 630 in the 5 V PCI signaling environment.

As shown in FIG. 6, the extra-pullup circuit 620 is coupled between a pullup signal NPULLUP and the output pad. The extra-pullup circuit 620 includes a pullup NOR gate (FETs 621, 622, 623, 624) connected to receive both the signal VIO from the level translation and buffering circuit 500 from FIG. 5 and an inverted pullup signal NPULLUP. The output of the NOR gate (FETs 621, 622, 623, 624) drives the gate of an extra-pullup NFET 625 which is coupled in drain-source relationship between the $V_{CC}$ supply voltage and a resistor coupled to the output pad 695. The resistor is for ESD protection and has minimal impact on the circuit functionality.

In the circuit of FIG. 6, the VIO signal will be high ($V_{CC}$) when the PCI signaling environment is 5 V, and no extra pullup drive capability is required. As shown in FIG. 6, the VIO signal is inverted by the NOR gate CMOS invertor (FETs 621, 623). Consequently, the gate-to-source voltage $V_{GS}$ will be low (0 V) and will not exceed the threshold voltage of extra-pullup NFET 625. Thus no extra pullup drive capability will be provided. If, on the other hand, VIO is low, the PCI signaling environment is 3.3 V, and extra pullup drive capability is required to match the PCI specifications. Thus, the VIO signal is inverted by CMOS invertor 621, resulting in a gate-to-source voltage $V_{GS}$ exceeding the threshold voltage $V_T$ extra-pullup NFET 625, causing additional current to be provided to the output pad.

The inverted pullup signal NPULLUP is low (0 V) when the pull-up stage 640 of the output driver circuit 600 is enabled to drive the output pad 695 high ($V_{CC}$), and is high ($V_{DD}$) when the pull-up stage 640 is disabled. The NOR gate (FETs 621, 622, 623, 624) is important because it provides extra pullup drive capability circuit functionality only when the pull-up stage 640 of the output driver circuit 600 is enabled.

The extra-pulldown circuit 630 is similar to the extra-pullup circuit 620, except that it has a pulldown NOR gate (FETS 631, 632, 633, 634) connected to receive both the NVIO signal from the level translation and buffering circuit 500 from FIG. 5, and a pulldown signal (NPULLDN in FIG. 6) derived from the pull-down/tri-state stage 650 of the output driver circuit 600. Additionally, the extra-pulldown circuit 630 includes an extra-pull-down NFET 635 which is driven by the output of the NOR gate (FETs 631, 632, 633, 634). The extra-pulldown circuit sinks additional current when the signaling environment is 5 V. This is in accordance with the PCI signaling specification.

It will be appreciated by one skilled in the art that the particular polarity of the various signals and the configuration of the various FETs in the above circuits may be altered to achieve the same circuit functionality, and it is to be understood that the present invention is not to be limited to the particular implementations detailed in FIGS. 3, 5 and 6.

Based upon the foregoing detailed description, the present invention provides a method and apparatus for use in an integrated circuit having a core supply voltage $V_{DD}$ and a $V_{CC}$/IO supply voltage which automatically detects a PCI signaling environment and accordingly adjusts the output drive capability to match PCI specifications.

Although the method and apparatus for automatically detecting the PCI signaling environment was described herein in the context of differentiating between 3.3 V and 5 V PCI signaling environments, the present invention may be similarly used in future migrations to a lower core voltage supply $V_{DD}$ of PCI signaling environments.

While illustrative and presently preferred embodiments of the invention have been described in detail herein, it is to be understood that the inventive concepts may be otherwise variously embodied and employed and that the appended claims are intended to be construed to include such variations except insofar as limited by the prior art.

What is claimed is:

1. An integrated Circuit for automatically detecting a Peripheral Component Interconnect signaling environment and for matching output voltage and output current characteristics of an output pad signal of the integrated circuit with Peripheral Component Interconnect signal specifications, the signaling environment being based on either a first voltage or a second voltage, the integrated circuit comprising:

a signaling environment detection circuit connected to receive an integrated circuit supply voltage and a reference voltage, wherein the reference voltage represents a nominal value between the first voltage and the second voltage, to compare the integrated circuit supply voltage with the reference voltage and to produce a detected environment signal representative of the signaling environment; and an output driver circuit connected to receive the detected environment signal for producing a pullup signal on an output pad when the output driver circuit is enabled to drive the output pad to a logical high state, and for producing a pulldown signal on the output pad when the output driver circuit is enabled to drive the output pad to a logical low state;

wherein the output driver circuit comprises an output characteristics adjustment circuit for adjusting the output voltage and output current of the output pad signal to match the Peripheral Component Interconnect signal specifications based on the detected environment signal, the output characteristics adjustment circuit comprising an extra-pullup circuit and an extra-pulldown circuit, wherein the extra-pullup circuit is connected to be enabled by the pullup signal and is connected to receive the detected environment signal to source additional current to the output pad to match the Peripheral Component Interconnect signal specifications when the detected environment signal indicates that the signaling environment is based on the first voltage, and wherein the extra-pulldown circuit is connected to be enabled by the pulldown signal and is connected to receive the detected environment signal to sink additional current from the output pad to match the Peripheral Component Interconnect signal specifications when the detected environment signal indicates that the signaling environment is based on the second voltage.

2. The integrated circuit of claim 1, wherein the extra-pullup circuit comprises:

a NOR gate for receiving the pullup signal and the detected environment signal and for producing an extra-pullup enable signal; and a pullup current source FET coupled between the integrated circuit supply voltage and the output pad, and having a gate driven by the extra-pullup enable signal; and wherein the extra-pulldown circuit comprises:

a NOR gate for receiving the pulldown signal and the detected environment signal and for producing an extra-pulldown enable signal; and a pulldown current sink FET coupled between the output pad and an integrated circuit ground, and having a gate driven by the extra-pulldown enable signal.

3. The integrated circuit of claim 2, wherein the signaling environment detection circuit comprises:

a differential input amplifier, receiving at inputs thereof the integrated circuit supply voltage and the reference voltage, for providing an output signal and a complement output signal indicative of the PCI signaling environment, a pair of source followers, each receiving a different one of the output signal and complement output signal and each receiving clock signals, the source followers being responsive to the states of the output signal and complement output signal to provide third and fourth output signals having states indicative of the states of the output signal and complement output signal, respectively, only when the received clock signals are in a second state, but being substantially non-responsive to the states of the output signal and complement output signal when the received clock signals are in a first state that is substantially opposite the second state; and a latch circuit having sense and latched modes and receiving the third and fourth output signals and the clock signals, the latch circuit being responsive to the occurrence of the second state of the clock signals to sense the states of the third and fourth output signals occurring during the occurrence of the second state of the clock signals, and being responsive to the occurrence of the first state of the clock signals to latch values indicative of the states of the third and fourth output signals last sensed upon a transition of the clock signal from the second state to the first state, the latched values being indicative of the magnitude of the integrated circuit supply voltage relative to the reference voltage.

4. The integrated circuit of claim 1, wherein the signaling environment detection circuit comprises:

a differential input amplifier, receiving at inputs thereof the integrated circuit supply voltage and the reference voltage, for providing an output signal and a complement output signal indicative of the PCI signaling environment, a pair of source followers, each receiving a different one of the output signal and complement output signal and each receiving clock signals, the source followers being responsive to the states of the output signal and complement output signal to provide third and fourth output signals having states indicative of the states of the output signal and complement output signal, respectively, only when the received clock signals are in a second state, but being substantially non-responsive to the states of the output signal and complement output signal when the received clock signals are in a first state that is substantially opposite the second state; and a latch circuit having sense and latched modes and receiving the third and fourth output signals and the clock signals, the latch circuit being responsive to the occurrence of the second state of the clock signals to sense the states of the third and fourth output signals occurring during the occurrence of the second state of the clock signals, and being responsive to the occurrence of the first state of the clock signals to latch values indicative of the states of the third and fourth output signals last sensed upon a transition of the clock signal from the second state to the first state, the latched values being indicative of the magnitude of the integrated circuit supply voltage relative to the reference voltage.

5. The apparatus of claim 1, the signaling environment detection circuit comprising a threshold comparator connected to receive the integrated circuit supply voltage and the reference voltage, for comparing the integrated circuit supply voltage with the reference voltage and for producing the detected environment signal of one polarity when the integrated circuit supply voltage exceeds the reference voltage and for producing the detected environment signal of an opposite polarity when the reference voltage exceeds the integrated circuit supply voltage.

6. The apparatus of claim 5, wherein the threshold comparator is implemented using differential current techniques.

7. The apparatus of claim 6, the threshold comparator comprising a differential input amplifier, receiving at inputs thereof the integrated circuit supply voltage and the reference voltage, for providing an output signal and a complement output signal indicative of the PCI signaling environment.

8. The apparatus of claim 4 wherein the differential input amplifier circuit, the pair of source followers and the latch circuit are each embodied as a plurality of FETS symmetrically arranged in a circuit layout about a center line of the circuit layout for substantially eliminating any differential noise component in opposing portions of the circuit layout.

9. The apparatus of claim 8 wherein, for each FET in one portion of the symmetrical layout, there is corresponding, electrically matched FET in the opposing portion of the symmetrical layout.

10. A method for automatically detecting a Peripheral Component Interconnect signaling environment and for matching output voltage and output current characteristics of an output signal of an integrated circuit with Peripheral Component Interconnect signal specifications, the signaling environment being based on either a first voltage or a second voltage, the method comprising the steps of:

(a) monitoring a supply voltage of the integrated circuit;

(b) comparing the supply voltage to a reference voltage to produce a detected environment signal representative of the signaling environment, wherein the reference voltage represents a nominal value between the first voltage and the second voltage;

(c) based on the detected environment signal, adjusting the output voltage and output current of the output signal to match the Peripheral Component Interconnect signal specifications by:

(c)(i) sourcing more current when the detected environment signal indicates that the signaling environment is based on the first voltage; and (c)(ii) sinking additional current when the detected environment signal indicates that the signaling environment is based on the second voltage.

11. The method of claim 10, step (b) further comprising the steps of:

(b)(i) producing the detected environment signal of one polarity when the supply voltage exceeds the reference voltage; and (b)(i) producing the detected environment signal of an opposite polarity when the reference voltage exceeds the supply voltage.

* * * * *